US010598951B2

(12) United States Patent
Moser et al.

(10) Patent No.: US 10,598,951 B2
(45) Date of Patent: Mar. 24, 2020

(54) APPARATUS FOR GENERATING LIGHT HAVING A PLURALITY OF WAVELENGTHS, METHOD FOR MANUFACTURING AN APPARATUS, USE OF A POSITIONING MODULE, METHOD FOR COMBINING LIGHT BEAMS, AND APPARATUS FOR GENERATING LIGHT HAVING A PLURALITY OF WAVELENGTHS

(71) Applicant: FISBA AG, St. Gallen (CH)

(72) Inventors: Hansruedi Moser, Hinterforst (CH); Marcel Wäspi, Häggenschwil (CH); Patrick Spring, Goldach (CH)

(73) Assignee: FISBA AG, St. Gallen (CH)

( * ) Notice: Subject to any disclaimer, the term of this patent is extended or adjusted under 35 U.S.C. 154(b) by 412 days.

(21) Appl. No.: 15/321,222

(22) PCT Filed: Jun. 23, 2015

(86) PCT No.: PCT/EP2015/064025
§ 371 (c)(1),
(2) Date: Dec. 22, 2016

(87) PCT Pub. No.: WO2016/005179
PCT Pub. Date: Jan. 14, 2016

(65) Prior Publication Data
US 2017/0153009 A1 Jun. 1, 2017

(30) Foreign Application Priority Data
Jul. 8, 2014 (EP) .................................... 14176182

(51) Int. Cl.
G02B 27/14 (2006.01)
G02B 27/30 (2006.01)
(Continued)

(52) U.S. Cl.
CPC .............. *G02B 27/30* (2013.01); *F21V 15/01* (2013.01); *F21V 17/005* (2013.01); *F21V 17/06* (2013.01);
(Continued)

(58) Field of Classification Search
CPC ........ F21V 17/005; F21V 15/01; F21V 17/06; G02B 5/3083; G02B 7/023; G02B 7/025;
(Continued)

(56) References Cited

U.S. PATENT DOCUMENTS 4,828,371 A 5/1989 McCaslin et al.
9,438,001 B2 9/2016 Rozynski
(Continued)

FOREIGN PATENT DOCUMENTS

DE 10 2011 005 014 A1 9/2012
EP 0220035 A2 4/1987
(Continued)

OTHER PUBLICATIONS

European Office Action issued in corresponding European Patent Application No. 14 176 182.5 dated Apr. 7, 2017.
(Continued)

*Primary Examiner* — Cara E Rakowski
*Assistant Examiner* — Magda Cruz
(74) *Attorney, Agent, or Firm* — Davis & Bujold PLLC; Michael J. Bujold

(57) ABSTRACT

An apparatus for generating light having a plurality of wavelengths comprises a housing (1) and light sources (2) inside the housing (1). The light sources (2) are especially in the form of laser diodes. Preferably, three light sources having different wavelengths are formed. The apparatus further comprises collimating lenses (3) for collimating a light beam emitted by the light sources (2), and beam guiding elements for bundling the light beams. The colli- (Continued)

Figure 1:
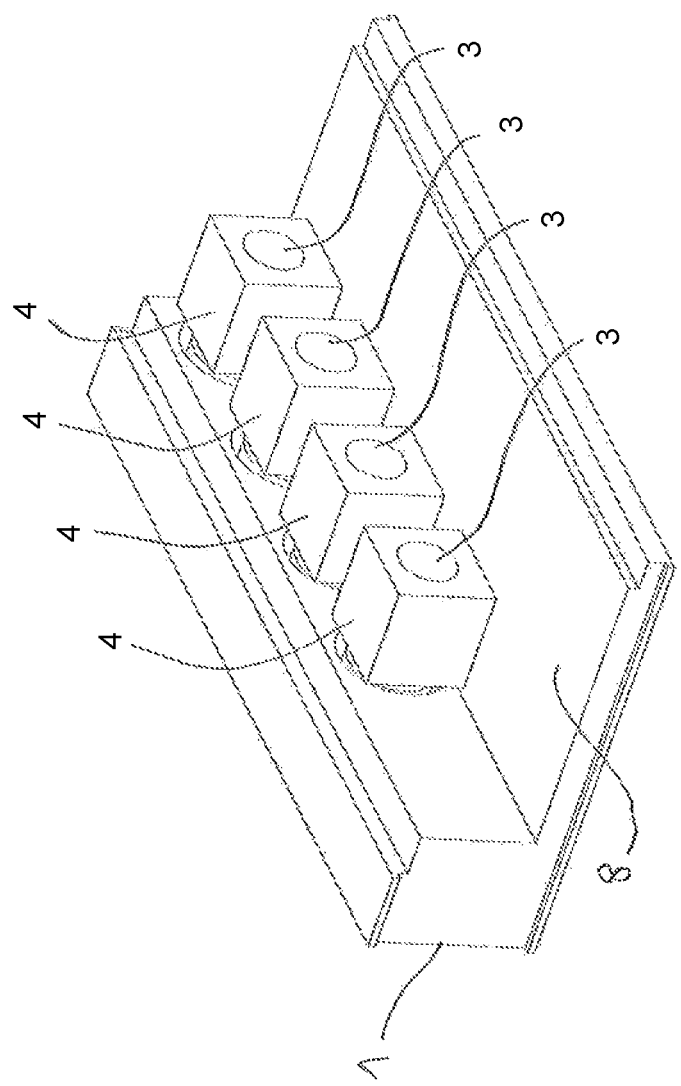

mating lenses (3) are disposed in a positioning module (4) that allows the collimating lenses (3) to be placed in different positions during the manufacturing process of the apparatus.

19 Claims, 7 Drawing Sheets

(51) Int. Cl.
| | |
|---|---|
| H01S 5/022 | (2006.01) |
| G02B 19/00 | (2006.01) |
| G02B 27/10 | (2006.01) |
| G02B 7/02 | (2006.01) |
| H01S 5/40 | (2006.01) |
| F21V 15/01 | (2006.01) |
| F21V 17/00 | (2006.01) |
| F21V 17/06 | (2006.01) |
| G02B 5/30 | (2006.01) |
| G02B 27/12 | (2006.01) |
| F21Y 115/30 | (2016.01) |
| F21Y 113/10 | (2016.01) |
| F21V 8/00 | (2006.01) |

(52) U.S. Cl.
CPC ........... *G02B 5/3083* (2013.01); *G02B 7/023* (2013.01); *G02B 7/025* (2013.01); *G02B 19/0057* (2013.01); *G02B 27/102* (2013.01); *G02B 27/1006* (2013.01); *G02B 27/126* (2013.01); *G02B 27/141* (2013.01); *H01S 5/02288* (2013.01); *H01S 5/4012* (2013.01); *H01S 5/4093* (2013.01); *F21Y 2113/10* (2016.08); *F21Y 2115/30* (2016.08); *G02B 6/0006* (2013.01); *H01S 5/02208* (2013.01)

(58) Field of Classification Search
CPC ............ G02B 19/0057; G02B 27/1006; G02B 27/102; G02B 27/126; G02B 27/141; G02B 27/30; G02B 6/0006; H01S 5/02288; H01S 5/4012; H01S 5/4093; H01S 5/02208; F21Y 2115/30; F21Y 2113/10
See application file for complete search history.

(56) References Cited

U.S. PATENT DOCUMENTS

| | | | |
|---|---|---|---|
| 9,448,416 B2 * | 9/2016 | Chifu | .................... G02B 27/48 |
| 2004/0240205 A1 * | 12/2004 | Hayakawa | ........... G02B 7/1821 362/257 |
| 2005/0270618 A1 * | 12/2005 | Uchiyama | .............. G09G 3/002 359/249 |
| 2006/0119805 A1 | 6/2006 | Wittenberg et al. | |
| 2009/0041070 A1 | 2/2009 | Yamagishi | |
| 2011/0037953 A1 | 2/2011 | Nizani et al. | |
| 2011/0063871 A1 * | 3/2011 | Tanaka | ................. G02B 6/4204 362/553 |
| 2011/0304828 A1 | 12/2011 | Khechana et al. | |
| 2012/0293774 A1 | 11/2012 | Inoue et al. | |
| 2012/0294326 A1 | 11/2012 | Seibert | |
| 2013/0321891 A1 * | 12/2013 | Ishida | ................ G02B 27/0172 359/212.1 |
| 2014/0016106 A1 | 1/2014 | Lin et al. | |
| 2014/0029076 A1 | 1/2014 | Kato et al. | |
| 2014/0185021 A1 * | 7/2014 | Yamagiwa | ......... G03B 21/2033 353/99 |
| 2015/0277213 A1 * | 10/2015 | Kilcher | ................ H04N 9/3129 353/31 |
| 2017/0146895 A1 * | 5/2017 | Ito | ...................... G03B 21/2013 |

FOREIGN PATENT DOCUMENTS

| | | | | |
|---|---|---|---|---|
| JP | 2004151681 A | | 5/2004 | |
| JP | 2009288520 A | | 12/2009 | |
| JP | 201032797 | | 2/2010 | |
| JP | 2010060897 A | | 3/2010 | |
| JP | 2010232370 A | * | 10/2010 | ............... G02B 3/00 |
| JP | 2010232370 A | | 10/2010 | |
| JP | 2012-247529 A | | 12/2012 | |
| JP | 2014126723 A | | 7/2014 | |
| KR | 2008-0024914 A | | 3/2008 | |
| WO | 2013/178280 A1 | | 12/2013 | |
| WO | 2014/023322 A1 | | 2/2014 | |

OTHER PUBLICATIONS

European Office Action issued in corresponding European Patent Application No. 14 176 182.5 dated Jul. 2, 2018.
European Search Report Corresponding to 14 17 6182 dated Jan. 27, 2015.
International Search Report Corresponding to PCT/EP2015/064025 dated Dec. 11, 2015.
Written Opinion Corresponding to PCT/EP2015/064025 dated Dec. 11, 2015.

* cited by examiner

APPARATUS FOR GENERATING LIGHT HAVING A PLURALITY OF WAVELENGTHS, METHOD FOR MANUFACTURING AN APPARATUS, USE OF A POSITIONING MODULE, METHOD FOR COMBINING LIGHT BEAMS, AND APPARATUS FOR GENERATING LIGHT HAVING A PLURALITY OF WAVELENGTHS

The invention relates to an apparatus for generating light having a plurality of wavelengths, a method for manufacturing an apparatus, the use of a positioning module, a method for combining light beams, and an apparatus for generating light having a plurality of wavelengths, according to the preamble of the independent claims.

Projection modules are already known which can project light having different colors in a miniaturized design. Such a projection apparatus is known from WO 2013/178280, for example, which discloses that three light sources emit light, the light is combined to form a beam in a beam combiner and is then projected onto a projection surface via a MEMS mirror. Furthermore, an optical modification apparatus is formed here, which modifies the individual colors to form a round beam diameter. Such an apparatus is very complex and, with its many component parts, can be manufactured in a miniaturizable and at the same time precise manner only with very great difficulty. Furthermore, the luminous efficiency is poor.

WO 2014/023322 furthermore discloses a projection apparatus in which laser diodes are arranged parallel alongside one another, wherein the laser diodes are adhesively bonded in place in receptacles. Inaccuracies in the alignment of the laser diodes are compensated for such that firstly the laser diodes are fixed, and then mirrors are used firstly for combining the light beams and for correcting the alignment errors of the laser diodes. This method is complicated to carry out and inaccurate in terms of the alignment of the diodes.

Therefore, it is an object of the present invention to avoid the disadvantages of the prior art and, in particular, to provide an apparatus and a method which enable the best possible superimposition of the individual colors, a high luminous efficiency and simplified manufacture.

The object is achieved by means of the characterizing part of the independent claims.

In particular, the object is achieved by means of an apparatus for generating light having a plurality of wavelengths, which apparatus comprises a housing. Light sources, in particular laser diodes, are arranged in the housing. Three light sources having different wavelengths in each case are preferably involved. Furthermore, the housing comprises collimating lenses for collimating a light beam which emerges from said light sources. In addition, the apparatus comprises beam guiding elements in order to combine the light beams. The collimating lenses are arranged in a positioning module, which enables the collimating lenses to be positioned in different positions within the positioning module in the process for manufacturing the apparatus.

Such an apparatus can be manufactured easily and in an automated manner and leads to a very accurate superimposition of the individual light beams.

Exactly three light sources having the colors red, green and blue are preferred in the apparatus. Furthermore, it is possible to add a fourth light source, in particular a second green light source, in order to optimize the light intensity in this specific color.

Preferably, no diaphragm is arranged between light source and collimating lens, in order to be able to utilize the full light power of the light source.

A positioning module according to the invention is embodied such that it allows a simple positioning of the collimating lens while the light source is already fixed in the housing. The positioning module is preferably a part of the apparatus and remains in the housing even after manufacture. The positioning module preferably has a dimensioning of a maximum of 3×3×3 mm.

The positioning module can be a cube or a hexagonal prism. A prism having eight or more sides would also be possible. The individual lateral surfaces of the prism serve here as standing surfaces for the prism, such that six standing surfaces are implemented for example in the case of a hexagonal prism.

A positioning module according to the invention has a front side and a rear side, wherein the front side is oriented toward the light source and the rear side is oriented away from the light source. Front and rear sides are connected by side surfaces on which the positioning module can be placed. A collimating lens is arranged between front and rear sides, such that the light from the light source can be transmitted through the collimating lens.

The collimating lenses are fitted in the positioning module and are positioned with the positioning module in the light beam in front of the light sources.

Such a positioning module enables simple positioning of the collimating lenses, wherein at the same time there is enough surface area present for accurate positioning and fixing of the position.

During the positioning of the positioning module, it is possible at the same time at least partly to compensate for possible alignment errors of the light sources.

The collimating lens in the positioning module can be arranged eccentrically, in particular relative to the side surfaces of the positioning module.

By means of an eccentric arrangement of the lens in the positioning module, the position of the lens by rotation of the positioning module and arrangement on a different side surface can bring about a correction of a possible alignment error of the light source.

The positioning module can be produced from metal, in particular aluminum or steel, or else already completely from glass.

The positioning module is preferably adhesively bonded in place in the apparatus, wherein shrinkage during curing or drying is taken into account in the metering of the adhesive.

The beam guiding elements can comprise dichroic mirrors, preferably one dichroic mirror per light source.

With dichroic mirrors, the individual light beams can be guided to the correct position, aligned and simultaneously combined to form one beam.

The beam guiding elements can comprise a prism telescope.

The beam diameter of the light beam can be optimized with a prism telescope. A prism telescope is preferably used for the already combined light beam downstream of the dichroic mirrors. However, it is also conceivable to use per light source a prism telescope upstream of the dichroic mirrors. However, this is disadvantageous for a miniaturized embodiment on account of the space required. The prism telescope optimizes the ratio of the two axes of the beam cross section in the direction 1, preferably to a range of 0.5 to 0.8.

The prism telescope can consist of individual prisms which are individually positionable for the purpose of optimally aligning the light beams.

An accurately superimposed beam approximated as much as possible to the round cross-sectional form thus arises.

One of the light sources can comprise a retardation plate, preferably a half-wave λ/2 (half-lambda) plate, downstream of the collimating lens in the beam propagation direction.

Consequently, in particular in the case of two light sources of the same color, the polarization of the emitted light can be changed, such that two beams having the same wavelength can be superimposed on one another. With the dichroic mirrors, the further wavelengths are then likewise combined into the beam.

The housing preferably has a maximum extent of 5×15×25 mm (H×W×L). The housing preferably consists of aluminum, steel or copper which are suitable for soldering.

Furthermore, a method for manufacturing an apparatus, in particular as described above, results in the object being achieved.

The method comprises the following steps:
fixing, preferably press-fitting, at least three light sources into a housing; the light sources are laser diodes, in particular;
providing a positioning module;
positioning collimating lenses in a light beam that emerges from the respective light sources, with the aid of the positioning module;
connecting positioning module and housing, in particular as a permanent connection;
positioning beam guiding elements in a light beam downstream of the collimating lenses, for the purpose of combining the individual light beams to form a common light beam.

Such a method can be carried out in an automated manner and enables an accurate alignment of the individual light beams and also an optimized luminous efficiency.

The positioning module enables the collimating lens to be positioned in three dimensions, namely position along the direction of propagation of the light from the light source (Z-direction), perpendicular to the direction of propagation (X-direction), and perpendicular to the direction of propagation and to the X-direction (Y-direction). The Y-direction is also referred to as the height. The positioning in the Y-direction is possible to a very limited extent by means of a collimating lens arranged eccentrically, without the beam becoming excessively asymmetrical.

The respective positioning modules can be adhesively bonded in place. Preferably, the positioning modules are firstly positioned and then adhesively bonded in place.

A positioning module adhesively bonded in place can be flexibly positioned and fixed. Furthermore, a precise knowledge of the adhesive also makes it possible to take account of the required amount for the precise height positioning of the collimating lens.

When the positioning modules are adhesively bonded in place, the amount of the adhesive and/or the size of the adhesive-bonding gap can be chosen so as to take account of shrinkage that occurs during the curing of the adhesive.

The position of the positioning module and thus of the collimating lens can thus be determined and set very accurately.

The adhesive can be epoxy adhesive.

The beam guiding elements can comprise dichroic mirrors, wherein the positioning elements are positioned so as to compensate for possible differences in height present between the individual laser beams. For this purpose, the positioning elements are aligned such that all the light beams are arranged at the same height on the mirrors.

By means of the positioning of the mirrors and positioning elements, it is possible to compensate for inaccuracies in all three directions (X-, Y-, Z-directions). In particular, compensation of the differences in height can be realized by means of the positioning of the positioning elements. It is thus possible to achieve a very accurately superimposed common beam.

The use of a positioning module for positioning lenses, in particular collimating lenses, furthermore results in the object being achieved.

The independent positioning of the positioning module with the collimating lenses results in a simple possibility for correcting alignment errors of light sources and for achieving an exact and stable collimation.

A method for combining light beams furthermore results in the object being achieved, wherein the light beams from at least two light sources, preferably laser diodes, are collimated by a respective collimating lens. The collimating lenses are arranged in a respective positioning module. The collimated beams are combined to form a combined beam by beam guiding elements.

Such a method is simple to carry out and results in a combined beam having high light intensity and the greatest possible overlap of the individual colors from the light sources.

An apparatus for generating light having a plurality of wavelengths furthermore results in the object being achieved, said apparatus comprising a housing and light sources, in particular laser diodes, arranged in the housing. Three light sources having different wavelengths in each case are preferably implemented. The apparatus furthermore comprises collimating lenses, preferably collimating lenses in a positioning module, for collimating a light beam which emerges from the light sources, and beam guiding elements to combine the light beams. The light sources are secured in the housing by a press-fit.

Such an apparatus results in an optimum heat transfer of the heat generated by the light sources into the surrounding housing. The light sources are press-fitted into the housing and not adjusted any more. Light sources introduced in this way can be mounted very rapidly and there is no need to carry out complicated adhesive-bonding, filling and adjusting processes.

Preferably, such an apparatus comprises a positioning module as described above.

The beam guiding elements preferably comprise a prism telescope as described above and dichroic mirrors, preferably one dichroic mirror per light source.

The apparatus can comprise a retardation plate, which changes the polarization of light from a light source downstream of the collimating lens.

Consequently, it is possible to combine even a plurality of light sources with one color by means of the dichroic mirrors.

Figure 2:
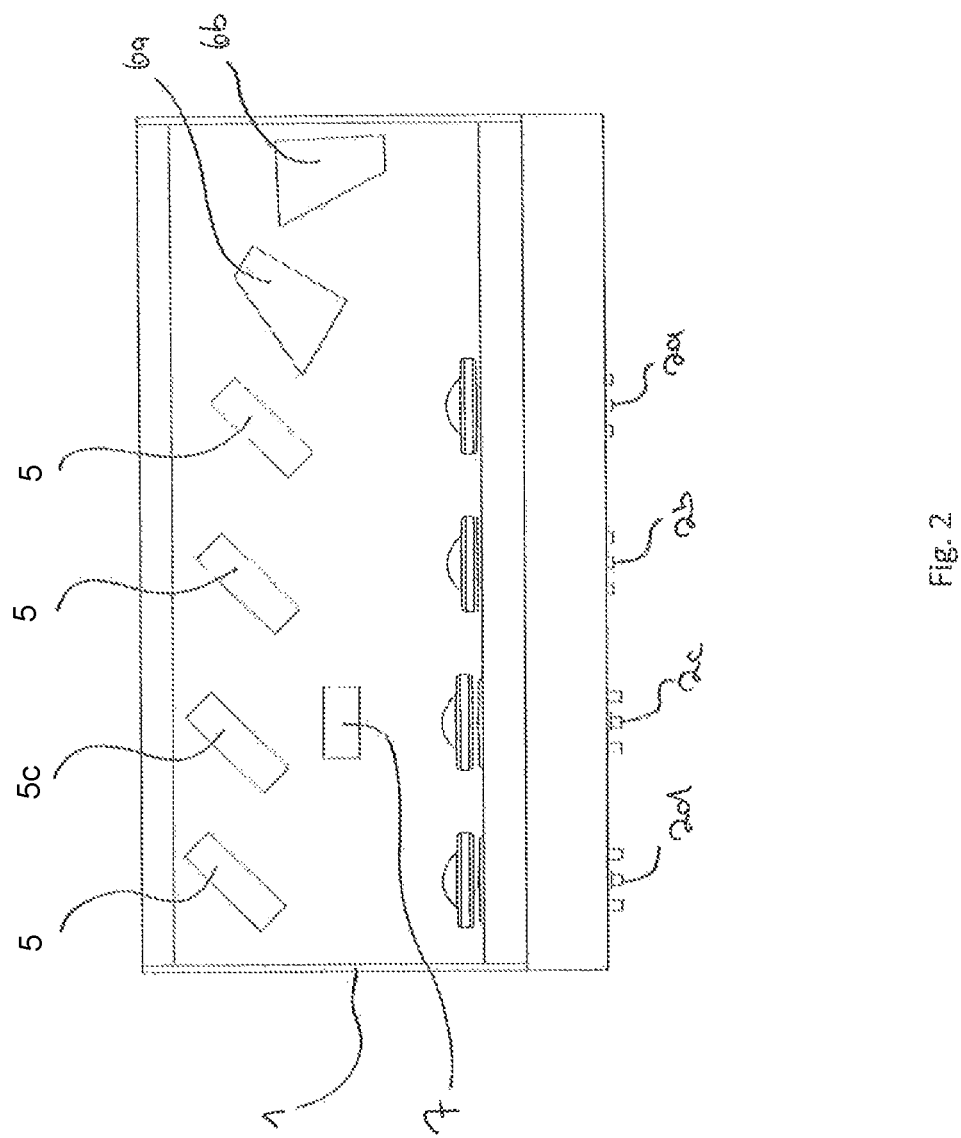
Figure 3:
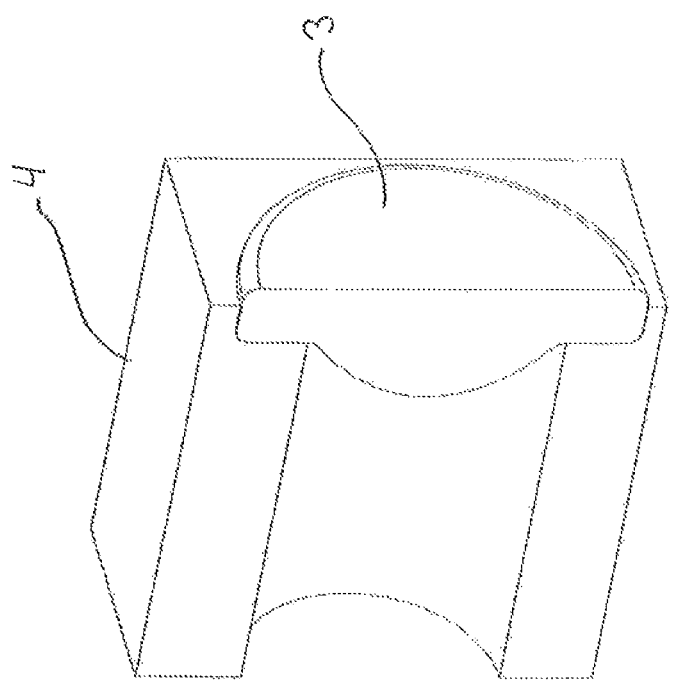
Figure 4:
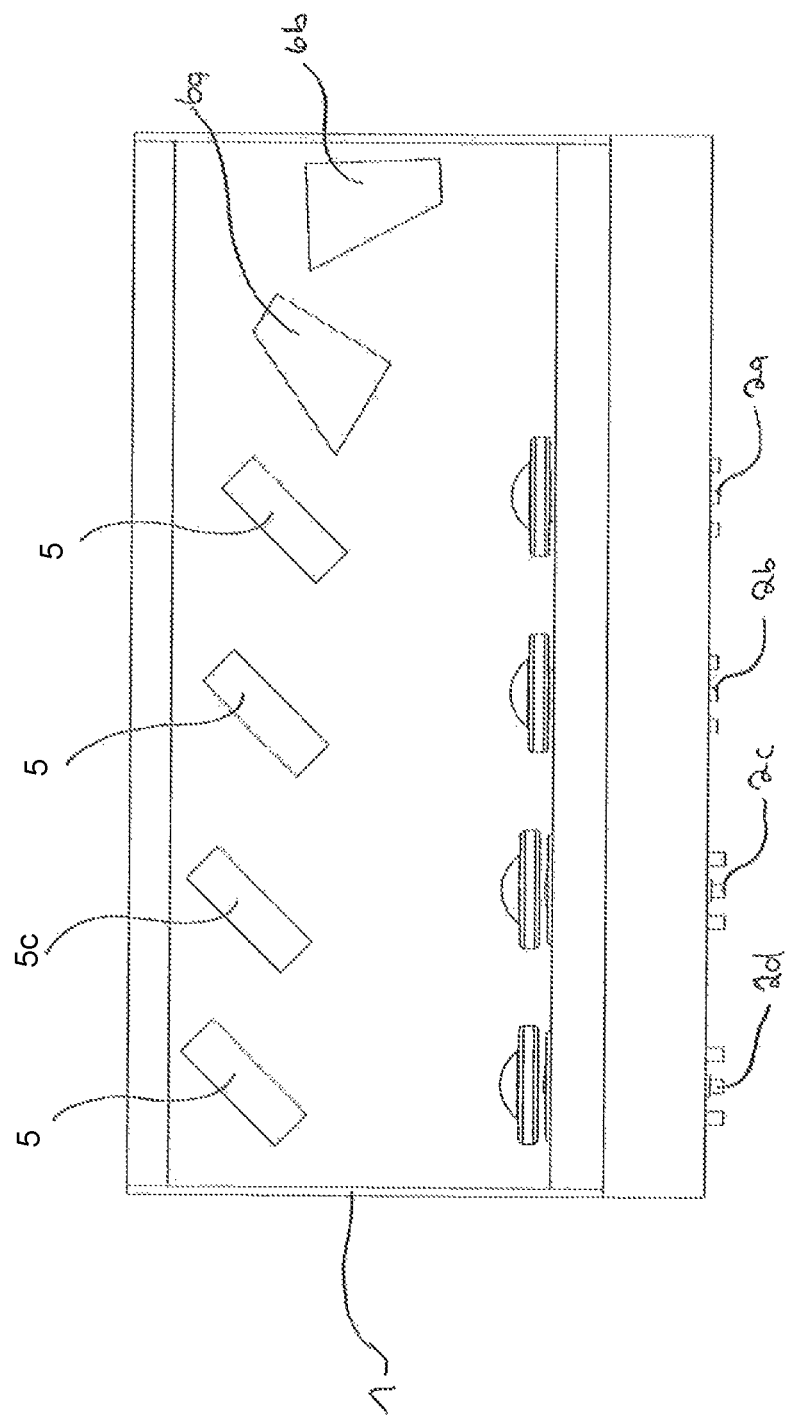
Figure 5:
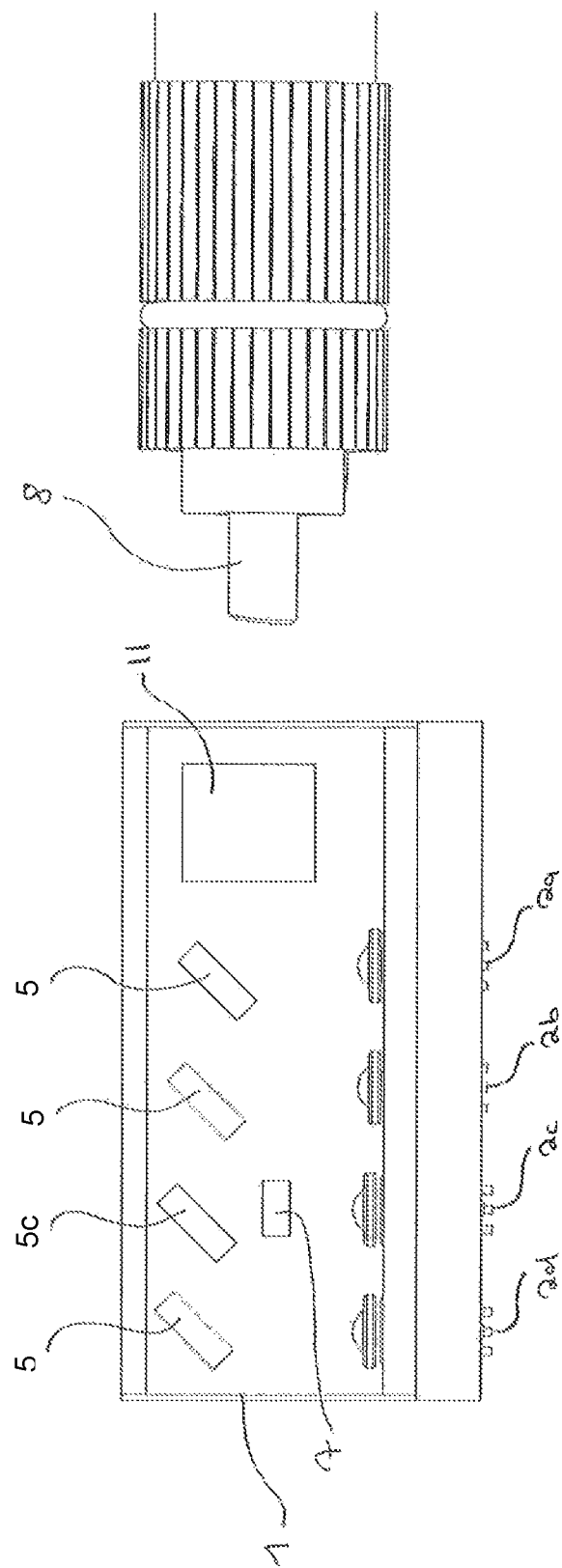
Figure 6:
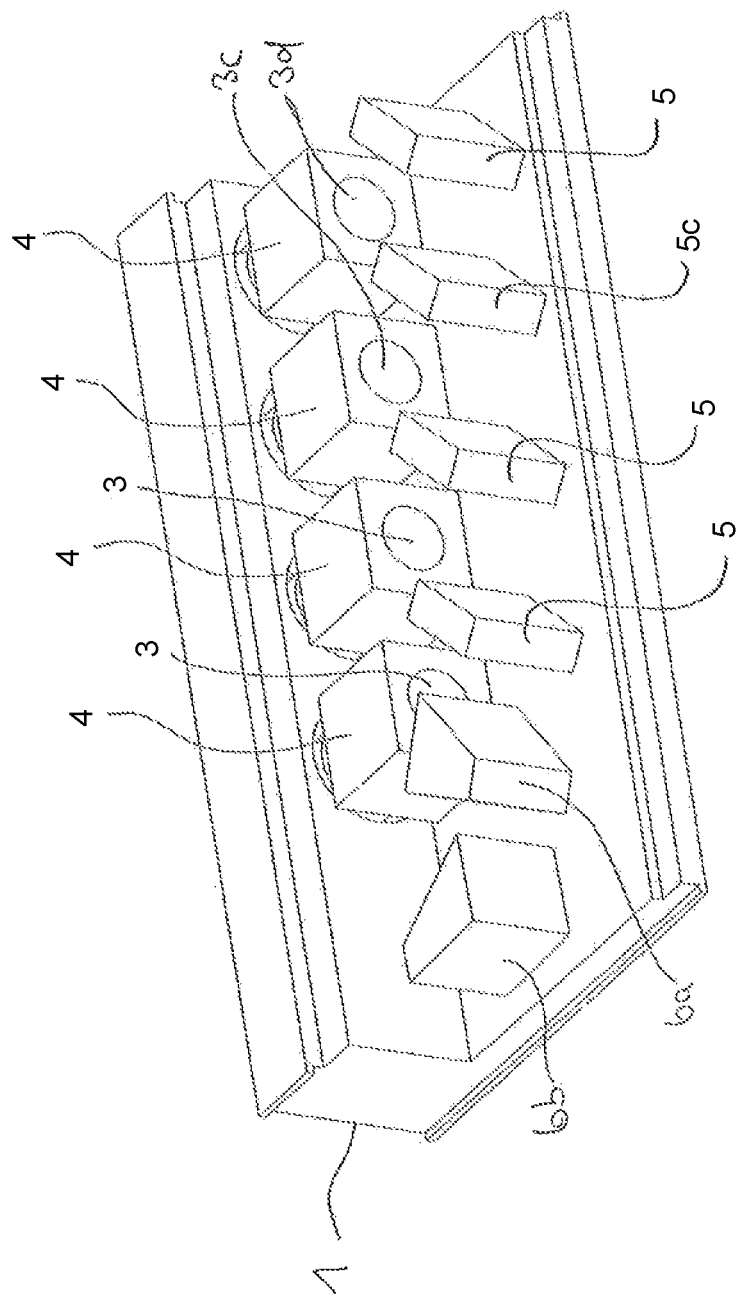
Figure 7:
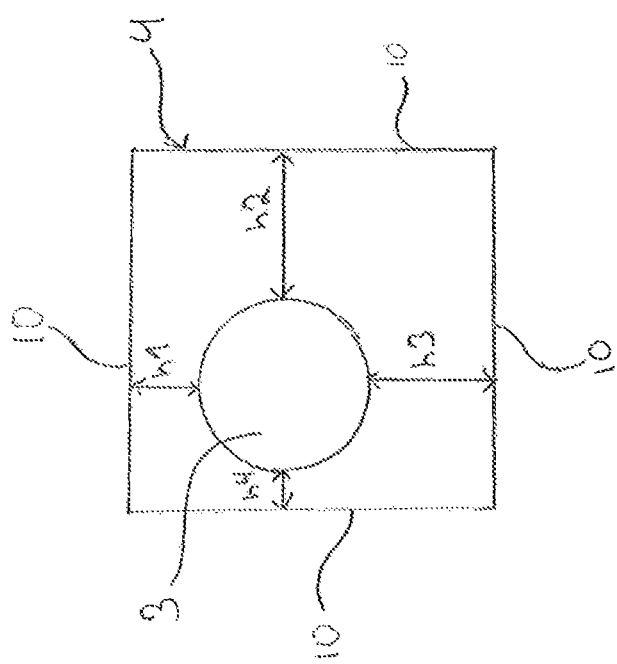

The invention is explained in greater detail below in exemplary embodiments with reference to figures, in which:

FIG. 1: shows a perspective illustration of a housing with positioning modules, FIG. 2: shows a schematic plan view of an apparatus according to the invention, FIG. 3: shows a cross section through a positioning module, FIG. 4: shows a schematic plan view of an apparatus according to the invention in accordance with a further embodiment, FIG. 5: shows a schematic plan view of an apparatus according to the invention for fiber coupling-in, FIG. 6: shows a perspective, three-dimensional view of an apparatus according to the invention;

FIG. 7: shows a cross section through a positioning module.

FIG. 1 shows an apparatus according to the invention comprising a housing 1. Four laser diodes are press-fitted (not visible) in the housing 1. Four positioning modules 4 are arranged in front of the laser diodes. The positioning modules 4 each have a collimating lens 3. The positioning modules 4 are used for aligning the light beams from the laser diodes. For this purpose, the openings in which the collimating lenses 3 are arranged are arranged eccentrically in the positioning module 4. Furthermore, the distance between laser diode and positioning module can be adapted during the positioning of the positioning module 4. The positioning modules 4 are secured to the base 9 of the housing 1 by adhesive bonding. The amount of adhesive is dimensioned so as also to set a correction of the height of the positioning module 4 above the housing 1, shrinkage of the adhesive being included in the calculation. In the finished state, the housing 1 additionally has a cover (not illustrated).

FIG. 2 shows a plan view of one embodiment of the apparatus according to the invention. The four light sources 2 emit a light beam onto the dichroic mirrors 5. The dichroic mirrors 5 have been fixed to the housing 1 after the press-fitting of the light sources 2 into the housing 1. Consequently, the dichroic mirrors 5 are also not at the same distance from the respective light sources 2. Two red light sources 2c, 2d are implemented by way of example in this embodiment. One of the red light sources 2c is therefore altered in terms of its polarization by means of a retardation plate 7. Consequently, the dichroic mirror 5c can allow the red light from the light source 2d to pass and at the same time reflect the red light from the source 2c. The light from all the light sources 2 is furthermore shaped by the prism telescope 6 to form a round beam. The prism telescope 6 consists of a first prism 6a and a second prism 6b, which can be adjusted independently of one another. For clarification, the lenses in front of the light sources 2 are illustrated without a positioning module 4 (see FIG. 3). However, the collimation in the embodiment is always carried out with positioning modules 4.

FIG. 3 shows a section through a positioning module 4 with a collimating lens 3. The collimating lens 3 is used for collimating the light beam from the light sources 2 (see FIGS. 1 and 2). The positioning module 4 enables a simple positioning of the collimating lens 3. Furthermore, the collimating lens 3 is arranged eccentrically in the positioning module 4, such that, in this case of a cubic positioning module 4, four different positions of the lens are possible.

FIG. 4 shows a plan view of an alternative embodiment of the apparatus according to the invention. The embodiment in FIG. 4 corresponds to the embodiment in FIG. 2 without the use of a retardation plate 7. The light sources 2 in this embodiment all emit different wavelengths, since a dichroic mirror 5 cannot be designed to be simultaneously transmissive and reflective for the same color. All the beam guiding elements are secured to the housing 1 by adhesive bonding.

FIG. 5 shows an embodiment of an apparatus according to the invention analogously to FIG. 2, the emerging light beams from the apparatus being coupled into an optical fiber 8. Such an apparatus can be used for medical purposes, in particular. In addition to the details illustrated in FIG. 2, the apparatus comprises a housing with a focusing lens 11, which focuses the emerging light beam into the optical fiber.

FIG. 6 shows a schematic three-dimensional view of an apparatus according to the invention. The housing 1 comprises four light sources (not visible). Positioning modules 4 are arranged in front of the respective light sources, a respective collimating lens 3 being arranged in said positioning modules. With the aid of the positioning modules 4, the respective collimating lens 3 is positioned such that possible errors in the alignment of the light source are already at least partly compensated for by the collimating lens. After emerging from the positioning module 4, the individual light beams are deflected by the dichroic mirrors 5 and then brought to as round a shape as possible by means of a prism telescope 6. The prism telescope 6 consists of a first prism 6a and a second prism 6b, which are individually positionable. A better roundness of the light beam can thus be achieved.

FIG. 7 shows a positioning module 4 according to the invention having four side surfaces 10. On the side surfaces 10, the positioning module 4 can be secured on the base 9 of a housing 1 (see FIG. 1). The collimating lens 3 is positioned eccentrically in the positioning module 4. The distances h1, h2, h3 and h4 thus differ from one another and are coordinated with the tolerances of the emitter positions at the different laser diodes.

The invention claimed is:

1. An apparatus for generating light having a plurality of wavelengths comprising:
   a housing,
   light sources arranged in the housing,
   collimating lenses for collimating a light beam emerging from the light sources, and
   beam guiding elements in order to combine the light beams,
   wherein the collimating lenses each are arranged in a separate positioning module, which enables the collimating lenses to be positioned in different positions during a process for manufacturing the apparatus,
   the positioning module is one of a cube which has a length, a width and a height that are all equal to one another, or a hexagonal prism, or a prism with eight or more sides, and
   the collimating lens is arranged eccentrically in the positioning module, such that by rotation of the positioning module and arrangement on a different side surface on the base of the housing, the position of the lens can bring about a correction of any alignment error of the light source.

2. The apparatus as claimed in claim 1, wherein 3 light sources having different wavelengths in each case are arranged in the housing.

3. The apparatus as claimed in claim 1, wherein the beam guiding elements comprise dichroic mirrors.

4. The apparatus as claimed in claim 3, wherein the beam guiding element comprise one dichroic mirror per light source.

5. The apparatus as claimed in claim 1, wherein the beam guiding elements comprise a prism telescope.

6. The apparatus as claimed in claim 5, wherein the prism telescope comprising individual prisms which are individually positionable for optimally aligning the light beams.

7. The apparatus as claimed in claim 1, wherein a light source comprises a retardation plate downstream of the collimating lens in a beam propagation direction.

8. The apparatus as claimed in claim 7, wherein the retardation plate is a λ/2 plate.

9. The apparatus as claimed in claim 1, wherein the light sources are secured in the housing by a press-fit.

10. The apparatus as claimed in claim 9, wherein the apparatus comprises a retardation plate, which changes the polarization of light from a light source downstream of the collimating lens.

11. A method of manufacturing an apparatus comprising:
fixing at least three light sources into a housing;
providing positioning module, wherein the collimating lens each are arranged eccentrically in a separate positioning module, and the positioning module is one of a cube which has a lenqth, a width and a height that are all equal to one another, or a hexagonal prism, or a prism with eight or more sides;
positioning collimating lenses in a light beam that emerges from the respective light sources, with aid of the positioning modules by rotating the positioning modules and arranging a different side surface on the base of the housing;
connecting the positioning module and the housing;
positioning beam guiding elements in a light beam downstream of the collimating lenses, for the purpose of combining the individual light beams to form a common light beam.

12. The method as claimed in claim 11, wherein the fixing is a press-fitting.

13. The method as claimed in claim 11, wherein the positioning module and the housing are connected as a permanent connection.

14. The method as claimed in claim 11, wherein the respective positioning modules are adhesively bonded in place.

15. The method as claimed in claim 14, wherein when the positioning modules are adhesively bonded in place, an amount of an adhesive and/or a contact pressure on the adhesive are/is chosen so as to take account of shrinkage that occurs during curing of the adhesive.

16. The method as claimed in claim 11, wherein the beam guiding elements comprise dichroic mirrors, wherein the positioning modules are positioned so as to compensate for possibly present differences in a height of the beams on the mirrors between the individual light beams.

17. A method of combining light beams, wherein light beams from at least two light sources are collimated by a respective collimating lens, the collimating lenses each are arranged in a respective positioning module, wherein the collimating lens each are arranged eccentrically in a separate positioning module, and the positioning module is one of a cube which has a length, a width and a height that are all equal to one another, or a hexagonal prism or a prism, with eight or more sides module, and the collimating lens is arranged eccentrically in the positioning module, such that by rotation of the positioning module and arrangement on a different side surface on the base of the housing, the position of the lens can bring about a correction of any alignment error of the light source, and combining the collimated beams to form a combined beam by means of beam guiding elements.

18. The method as claimed in claim 17, wherein three light sources having different wavelengths in each case are arranged in the housing.

19. The method as claimed in claim 17, wherein the collimating lenses are arranged in a positioning module.

* * * * *